(12) United States Patent
Sakairi

(10) Patent No.: US 7,621,799 B2
(45) Date of Patent: Nov. 24, 2009

(54) POLISHING METHOD AND POLISHING DEVICE

(75) Inventor: Takashi Sakairi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/830,310

(22) Filed: Jul. 30, 2007

(65) Prior Publication Data

US 2008/0113509 A1    May 15, 2008

(30) Foreign Application Priority Data

Aug. 8, 2006    (JP) .............................. 2006-215213

(51) Int. Cl.
*B24B 1/00* (2006.01)
(52) U.S. Cl. .............................. 451/36; 451/37; 451/44; 451/59; 451/60; 451/299; 451/303; 451/307
(58) Field of Classification Search .................. 451/36, 451/37, 41, 44, 59, 60, 296, 299, 303, 307, 451/446
See application file for complete search history.

(56) References Cited

U.S. PATENT DOCUMENTS

| | | | | |
|---|---|---|---|---|
| 6,558,239 | B2* | 5/2003 | Kunisawa et al. ........... | 451/303 |
| 6,699,299 | B2* | 3/2004 | Sachan et al. .................. | 51/298 |
| 7,195,545 | B2* | 3/2007 | Nakayama et al. ............ | 451/44 |
| 7,367,873 | B2* | 5/2008 | Ishii et al. .................... | 451/168 |
| 2004/0106363 | A1* | 6/2004 | Ishii et al. ..................... | 451/65 |
| 2005/0148290 | A1* | 7/2005 | De Rege Thesauro et al. . | 451/41 |
| 2005/0159085 | A1* | 7/2005 | Scott ............................ | 451/41 |
| 2008/0057832 | A1* | 3/2008 | Schroeder et al. ............. | 451/36 |

FOREIGN PATENT DOCUMENTS

| | | |
|---|---|---|
| JP | 2001-044148 | 2/2001 |
| JP | 2001-345294 | 12/2001 |
| JP | 2003-163188 | 6/2003 |
| JP | 2003-209075 | 7/2003 |
| JP | 2003-234314 | 8/2003 |
| JP | 2003-273045 | 9/2003 |
| JP | 2004-103825 | 4/2004 |
| JP | 2006-066891 | 3/2006 |
| JP | 2007-317702 | 12/2007 |
| JP | 2008-041781 | 2/2008 |
| WO | WO01/33620 | 5/2001 |
| WO | 2005-081301 | 9/2005 |

OTHER PUBLICATIONS

Japanese Office Action dated May 8, 2008 for U.S. Appl. No. 2006-215213.
Japanese Office Action dated Aug. 5, 2008 for Application No. 2006-215213.

* cited by examiner

*Primary Examiner*—Eileen P. Morgan
(74) *Attorney, Agent, or Firm*—Sonnenschein Nath & Rosenthal LLP

(57) ABSTRACT

Disclosed herein is a polishing method for polishing the end surface of a wafer by using a polishing tape, wherein the end surface of the wafer is polished in the condition where a polishing liquid containing an oxidizing agent is supplied to the end surface of the wafer.

18 Claims, 6 Drawing Sheets

POLISHING METHOD AND POLISHING DEVICE

CROSS REFERENCES TO RELATED APPLICATIONS

The present invention contains subject matter related to Japanese Patent Application JP 2006-215213 filed in the Japan Patent Office on Aug. 8, 2006, the entire contents of which being incorporated herein by reference.

BACKGROUND OF THE INVENTION

1. Field of the Invention

The present invention relates to a polishing method and polishing device, and more particularly to a polishing method and polishing device using a polishing tape having abrasive grains fixed to the front surface thereof or asperities formed on the front surface thereof.

2. Description of the Related Art

In the fabrication of semiconductor devices on a wafer, various processing steps such as film deposition, etching, and planarization are repeated. In the past, it is sufficient that the condition of processing in each step be uniform within the wafer. However, it has become difficult to maintain the uniformity within the wafer in relation to an increase in diameter of the wafer. In particular, it has become difficult to control the processing of the end surface of the wafer as maintaining the uniformity within the wafer.

Further, a metal material such as copper (Cu) having an effect on transistor characteristics has been used for wiring on the wafer. For example, in the fabrication of semiconductor devices using a silicon (Si) wafer, it is necessary to protect the lower surface and end surface of the wafer in the processing step for Cu wiring on the wafer, so that the processing step has become increasingly complicated. Due to the complication of the processing step, it is very difficult to control particles on the end surface of the wafer present between the upper and lower surfaces of the wafer. Accordingly, in recent years, the end surface of the wafer has been polished in the process of forming semiconductor devices to thereby suppress the generation of foreign matter from the end surface of the wafer (see Japanese Patent Laid-Open No. 2001-345294, for example).

As a method of polishing the end surface of a wafer, it is known that a polishing cloth is pressed on the end surface of the wafer being rotated in the condition where a polishing slurry containing abrasive grains is supplied onto the upper surface of the wafer (see Japanese Patent Laid-Open No. 2003-209075, for example). According to this method, the end surface of the wafer is polished in the condition where the abrasive grains are not fixed to the polishing cloth, so that polishing marks by the abrasive grains are hardly left on the end surface of the wafer. However, after the polishing, it is necessary to perform a cleaning step using a cleaning liquid having a strong cleaning power, so as to remove the abrasive grains from the wafer. This cleaning step is difficult to perform in the condition where semiconductor devices are mounted on the wafer, so that the processing steps to which such cleaning is applicable are limited.

There has been reported a method of polishing the end surface of a wafer by using a polishing tape (polishing film) having abrasive grains fixed to the front surface thereof (see Japanese Patent Laid-Open No. 2003-163188, for example). An example of this polishing method will now be described with reference to FIGS. 8A and 8B. As shown in FIG. 8A, reference numeral 40 generally denotes a polishing tape composed of a film base 41 and an adhesive layer 42 formed on the front surface of the film base 41. Adhesive grains 43 are fixed to the front surface of the adhesive layer 42. The polishing tape 40 is pressed on the end surface of a rotating wafer W so that the abrasive grains 43 cut into the end surface of the wafer W. In this polishing method, pure water is generally used as a polishing liquid rather than the polishing slurry containing abrasive grains. Accordingly, after the polishing, it is not necessary to perform strong cleaning, so that this polishing method can be easily applied to the fabrication of semiconductor devices.

SUMMARY OF THE INVENTION

However, this polishing method has the following problem. Particularly in the case that diamond is used as the abrasive grains, polishing marks D' by the abrasive grains 43 are easily left on the end surface of the wafer W as shown in FIG. 8B which is an enlarged view of a region Y shown in FIG. 8A, causing the occurrence of damage such as cracks on the end surface of the wafer W.

There is a need to provide a polishing method and polishing device which can polish the end surface of a wafer to remove an undesired film from the end surface of the wafer in the condition where the end surface of the wafer is protected.

In accordance with an embodiment of the present invention, there is provided a polishing method for polishing the end surface of a wafer by using a polishing tape, wherein the end surface of the wafer is polished in the condition where a polishing liquid containing an oxidizing agent is supplied to the end surface of the wafer.

Preferably, the polishing tape has abrasive grains fixed to the front surface thereof, and the end surface of the wafer is polished by making the front surface of the polishing tape into pressure contact with the end surface of the wafer. As a modification, the polishing tape has asperities formed on the front surface thereof, and the end surface of the wafer is polished by making the front surface of the polishing tape into pressure contact with the end surface of the wafer. Preferably, the end surface of the wafer is polished in the condition where an oxide film as a protective film is formed on the end surface of the wafer. Further, a metal film is formed on the end surface of the wafer through an under dielectric film, and the end surface of the wafer is polished in the condition where the metal film is oxidized by the oxidizing agent, thereby removing the metal film. In this case, the end surface of the wafer is polished in the condition where a polishing liquid containing a metal complexing agent is supplied in combination with the polishing liquid containing the oxidizing agent to the end surface of the wafer.

According to this polishing method, the end surface of the wafer is polished by the polishing tape in the condition where the polishing liquid containing the oxidizing agent is supplied to the end surface of the wafer. Accordingly, even when silicon forming the wafer is exposed to the end surface of the wafer by the polishing, an oxide film as a protective film is formed on the end surface of the wafer by the oxidizing agent contained in the polishing liquid during the polishing operation. As a result, polishing marks by the abrasive grains of the polishing tape are hardly left on the end surface of the wafer. Further, in the case of removing a metal film formed on the end surface of the wafer through an under dielectric film by this polishing method, the surface of the metal film is oxidized to be weakened by the oxidizing agent contained in the polishing liquid. Accordingly, the metal film can be selectively removed by polishing in the condition where the end surface of the wafer is protected by the dielectric film formed under the metal film.

In accordance with another embodiment of the present invention, there is provided a polishing device for polishing the end surface of a wafer by using a polishing tape, including a wafer holding section configured to rotatably hold the wafer; a polishing liquid supplying section having at least one nozzle for supplying a polishing liquid to the surface of the wafer held by the wafer holding section; a tape holding section configured to hold the polishing tape under tension so that the front surface of the polishing tape is opposed to the end surface of the wafer held by the wafer holding section; and a tape pressing section having a pad for making the front surface of the polishing tape held under tension by the tape holding section in pressure contact with the end surface of the wafer held by the wafer holding section.

Preferably, the at least one nozzle includes a nozzle for supplying a polishing liquid containing an oxidizing agent onto a substantially central portion of the upper surface of the wafer. Alternatively, the at least one nozzle includes a nozzle for supplying a polishing liquid containing an oxidizing agent directly toward the end surface of the wafer. Further, the at least one nozzle includes a first nozzle for supplying a first polishing liquid containing an oxidizing agent directly toward the end surface of the wafer and a second nozzle for supplying a second polishing liquid containing a metal complexing agent onto a substantially central portion of the upper surface of the wafer.

According to this polishing device, the polishing liquid supplying section has at least one nozzle for supplying the polishing liquid to the end surface of the wafer. Accordingly, in the case of polishing the end surface of the wafer after a metal wiring step in the condition where a metal film is formed on the end surface of the wafer through an under dielectric film, a polishing liquid containing an oxidizing agent and a polishing liquid containing a metal complexing agent can be supplied from separate nozzles. In this case, the surface of the metal film is oxidized to be weakened by the oxidizing agent. Accordingly, the metal film can be selectively removed by polishing in the condition where the end surface of the wafer is protected by the dielectric film formed under the metal film.

In summary, the polishing method and polishing device according to an embodiment of the present invention can exhibit an effect that the end surface of the wafer can be polished in its protected condition, thereby preventing the production of cracks on the end surface of the wafer.

DETAILED DESCRIPTION OF THE PREFERRED EMBODIMENTS

The polishing method and polishing device according to an embodiment of the present invention will now be described in detail with reference to the drawings.

First Preferred Embodiment

<Polishing Device>

Figure 1:
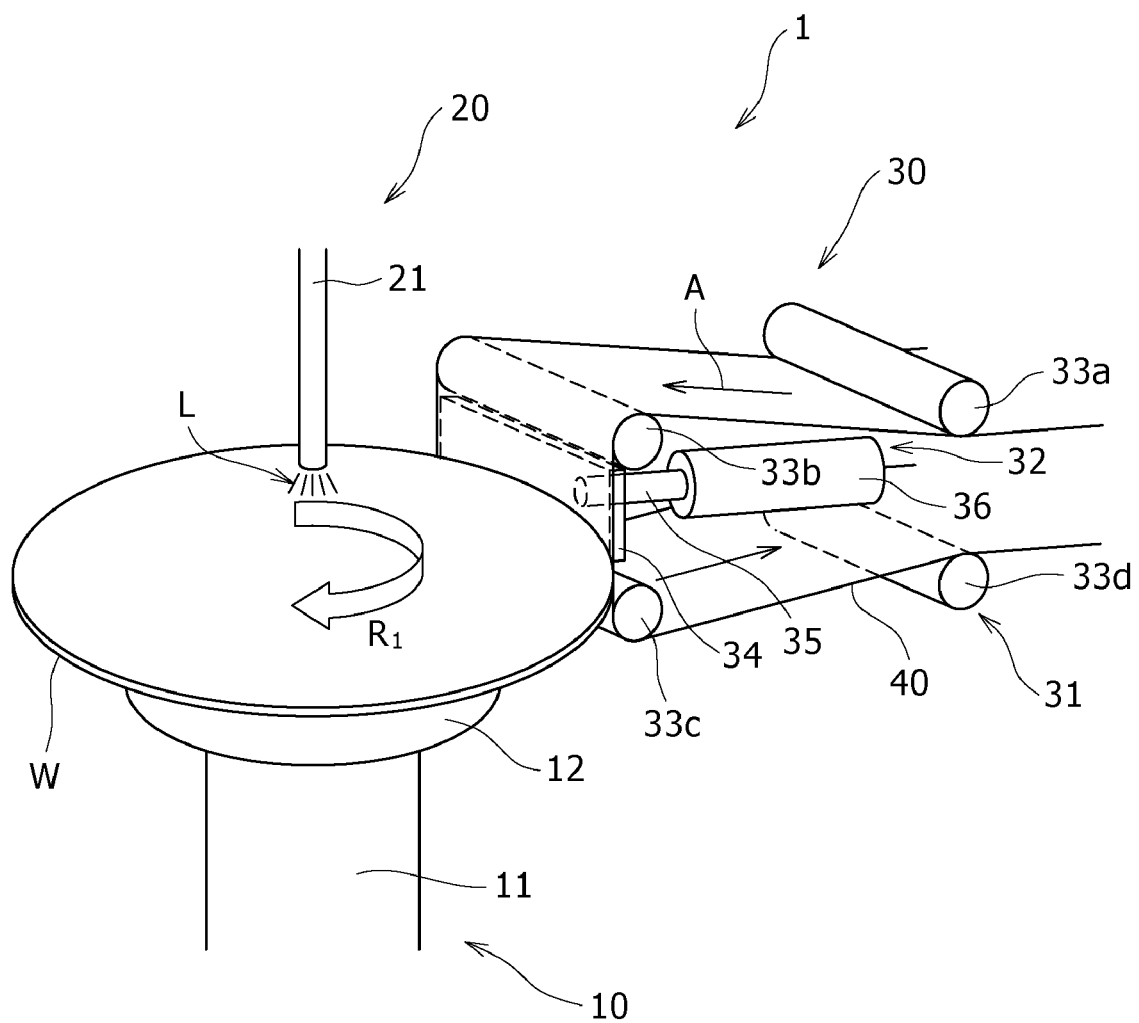
FIG. 1 is a perspective view for illustrating a polishing device according to a first preferred embodiment of the present invention.

A polishing device 1 according to a first preferred embodiment of the present invention will now be described. FIG. 1 is a perspective view showing a general configuration of the polishing device 1. As shown in FIG. 1, the polishing device 1 includes a wafer holding section 10 for rotatably holding a wafer W, a polishing liquid supplying section 20 for supplying a polishing liquid L to the upper surface of the wafer W held by the wafer holding section 10, and a polishing head 30 for polishing the end surface of the wafer W held by the wafer holding section 10 during rotation of the wafer W.

The wafer holding section 10 includes a rotating shaft 11 connected to an external motor (not shown) and a holding table 12 fixed to the upper end of the rotating shaft 11. The holding table 12 has a plurality of holes (not shown) communicating with an external vacuum pump (not shown), wherein the vacuum pump is driven to attach the wafer W to the holding table 12 by a vacuum chucking method, thus holding the wafer W by the wafer holding section 10. The wafer W held by the wafer holding section 10 is rotated in the direction shown by an arrow $R_1$ in FIG. 1, for example, by driving the external motor mentioned above to thereby rotate the rotating shaft 11.

The polishing liquid supplying section 20 includes a nozzle 21 for supplying the polishing liquid L provided by a chemical solution containing an oxidizing agent onto the upper surface of the wafer W held by the wafer holding section 10. Although not shown, the nozzle 21 is connected through piping provided with a flowmeter to a reservoir tank for storing the polishing liquid L. The nozzle 21 is located so as to supply the polishing liquid L to a substantially central portion of the upper surface of the rotating wafer W. The reservoir tank for the polishing liquid L is provided with a heating mechanism, so that the polishing liquid L heated by the heating mechanism can be supplied to the upper surface of the wafer W. The polishing liquid L supplied from the nozzle 21 onto the upper surface of the rotating wafer W is fed toward the end surface of the rotating wafer W by a centrifugal force. While the nozzle 21 is located so as to supply the polishing liquid L to a substantially central portion of the upper surface of the rotating wafer W in this preferred embodiment, the nozzle 21 may be located so as to supply the polishing liquid L directly toward the end surface of the wafer W held by the wafer holding section 10.

The polishing head 30 includes a tape holding section 31 for holding a polishing tape 40 under tension in the condition where the front surface of the polishing tape 40 having abrasive grains is opposed to the end surface of the wafer W held by the wafer holding section 10. The polishing head 30 further includes a tape pressing section 32 having a pad 34 for pressing the polishing tape 40 held under tension by the tape holding section 31 from the back surface of the polishing tape 40 against the end surface of the wafer W held by the wafer holding section 10.

The tape holding section 31 includes a pair of support plates (not shown) opposed to each other at a position adjacent to the wafer holding section 10 and first, second, third, and fourth rollers 33a, 33b, 33c, and 33d horizontally extending parallel to each other between the above support plates. A tape supply section and a tape take-up section (both not shown) are arranged parallel to the first to fourth rollers 33a to 33d. A roll of the polishing tape 40 is adapted to be mounted on the tape supply section. Further, a motor (not shown) is connected to the tape take-up section. By driving this motor, the polishing tape 40 is drawn from the tape supply section, moved in the direction shown by an arrow A in FIG. 1 so as to pass the first roller 33a, the second roller 33b, the third roller 33c, and the fourth roller 33d in this order, and taken up by the tape take-up section.

The polishing tape 40 is held under tension by the second roller 33b and the third roller 33c in such a manner that the front surface of the polishing tape 40 having abrasive grains is opposed to the end surface of the wafer W held by the wafer holding section 10. The end surface of the wafer W is so positioned as to face a substantially central portion of the polishing tape 40 stretched between the second roller 33b and the third roller 33c.

The tape pressing section 32 includes the pad 34, a shaft 35 to which the pad 34 is fixed, and a piston cylinder 36 for axially moving the shaft 35. By driving the piston cylinder 36, the shaft 35 is moved forward to thereby press the polishing tape 40 through the pad 34 from the back surface of the polishing tape 40 against the end surface of the wafer W held by the wafer holding section 10. The pressure applied from the polishing tape 40 to the end surface of the wafer W is adjustable by adjusting the amount of axial movement of the shaft 35.

Figure 2:
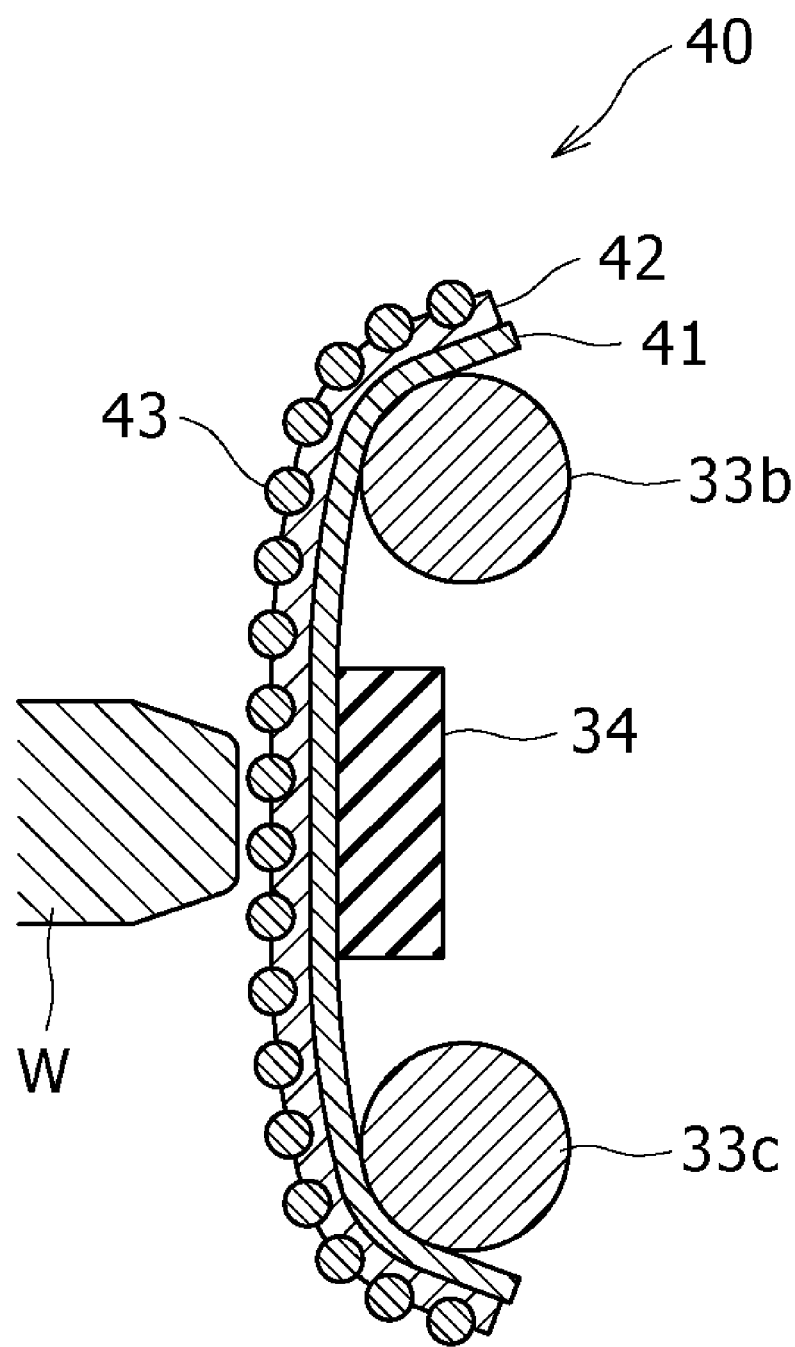
FIG. 2 is an enlarged sectional view of an essential part of the polishing device shown in FIG. 1.

As shown in FIG. 2, the polishing tape 40 is composed of a film base 41 and an adhesive layer 42 formed on the front surface of the film base 41. For example, the film base 41 is formed of PET, and the adhesive layer 42 is formed of polyester resin. Further, abrasive grains 43 of diamond, for example, are fixed to the adhesive layer 42. While the adhesive layer 42 is formed of polyester resin in this preferred embodiment, the material of the adhesive layer 42 is not limited to polyester resin in the present invention. For example, any other resin materials such as polyurethane resin and formed materials thereof may be used for the material of the adhesive layer 42. Further, the material of the abrasive grains 43 is not limited to diamond in the present invention. For example, silicon carbide (SiC), aluminum oxide ($Al_2O_3$), chromium oxide ($Cr_2O_3$), iron oxide ($Fe_2O_3$), cerium oxide ($Ce_2O_3$), and silica may be used for the material of the abrasive grains 43.

<Polishing Method>

Figure 3A:
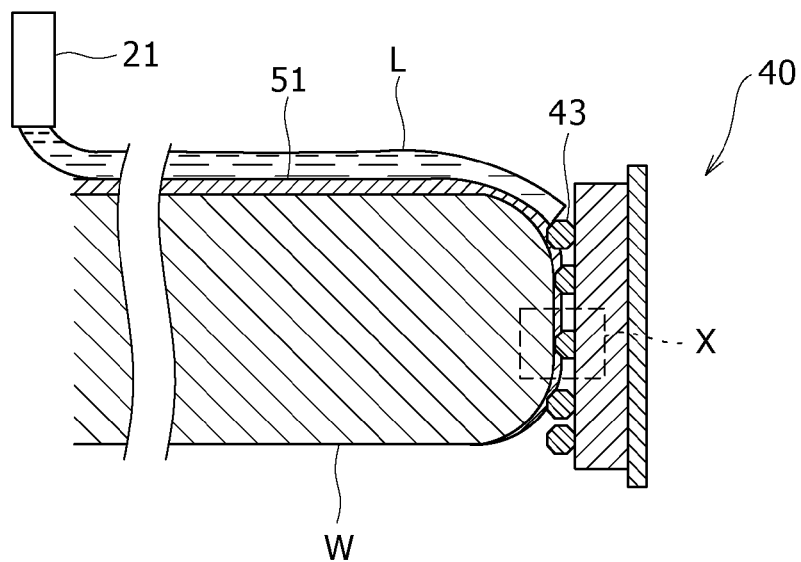
FIG. 3A is a sectional view for illustrating a polishing method according to the first preferred embodiment.
Figure 3B:
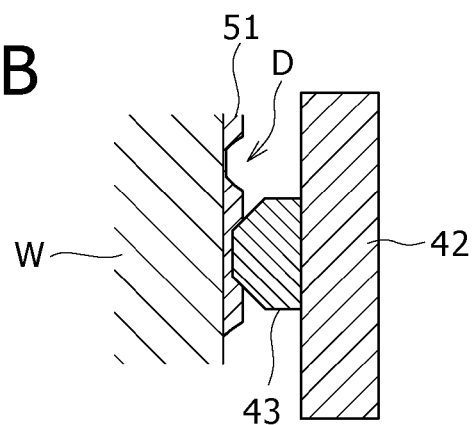
FIG. 3B is an enlarged view of a region X shown in FIG. 3A.

The operation of the polishing device 1 according to the first preferred embodiment of the present invention, i.e., a polishing method according to the first preferred embodiment of the present invention will now be described with reference to FIGS. 3A and 3B. In the following description for the polishing method, the reference numerals denoting the components of the polishing device 1 shown in FIGS. 1 and 2 are used.

First, the wafer W is held to the wafer holding section 10 by a vacuum chucking method, and the rotating shaft 11 is rotated to thereby rotate the wafer W together with the holding table 12.

Next, the polishing liquid L containing an oxidizing agent such as hydrogen peroxide is supplied from the nozzle 21 of the polishing liquid supplying section 20 to a substantially central portion of the upper surface of the wafer W held by the wafer holding section 10. At this time, the polishing liquid L supplied from the nozzle 21 onto the upper surface of the wafer W is fed toward the end surface of the wafer W because the wafer W is in rotation. By supplying the polishing liquid L to a substantially central portion of the upper surface of the wafer W, it is possible to remove particles splashed due to rotation of the wafer W in performing the polishing.

As hereinafter described, an oxide film ($SiO_2$ film in this preferred embodiment) 51 functioning as a protective film is formed on the upper surface and end surface of the wafer W of Si by supplying the polishing liquid L containing an oxidizing agent. The concentration of hydrogen peroxide contained in the polishing liquid L is preferably set in the range of 3 wt % to 30 wt %, and the temperature of the polishing liquid L is preferably adjusted in the range of 25° C. to 80° C. Preferably, the higher the temperature of the polishing liquid L in the above range, the more easily the oxide film 51 is formed on the Si wafer W.

On the other hand, the motor connected to the tape take-up section in the tape holding section 31 is driven to thereby stretch the polishing tape 40 between the second roller 33b and the third roller 33c in the condition where the abrasive grains 43 provided on the front surface of the polishing tape 40 are opposed to the end surface of the wafer W held by the wafer holding section 10. Thereafter, the piston cylinder 36 of the tape pressing section 32 is driven to thereby forward move the pad 34 fixed to the shaft 35, thus pressing the abrasive grains 43 of the polishing tape 40 onto the end surface of the rotating wafer W. As a result, the end surface of the wafer W is polished by the abrasive grains 43.

During the polishing operation, the polishing liquid L containing an oxidizing agent is supplied to the upper surface and end surface of the wafer W. Accordingly, the silicon oxide film ($SiO_2$ film) 51 is formed by the oxidizing agent on the upper surface and end surface of the wafer W. That is, the end surface of the wafer W coated with the silicon oxide film 51 is polished. As shown in FIG. 3B which is an enlarged view of a region X shown in FIG. 3A, the $SiO_2$ film 51 formed on the end surface of the Si wafer W functions as a protective film, so that polishing marks D formed on the end surface of the Si wafer W by the abrasive grains 43 can be suppressed by the $SiO_2$ film 51.

Figure 4:
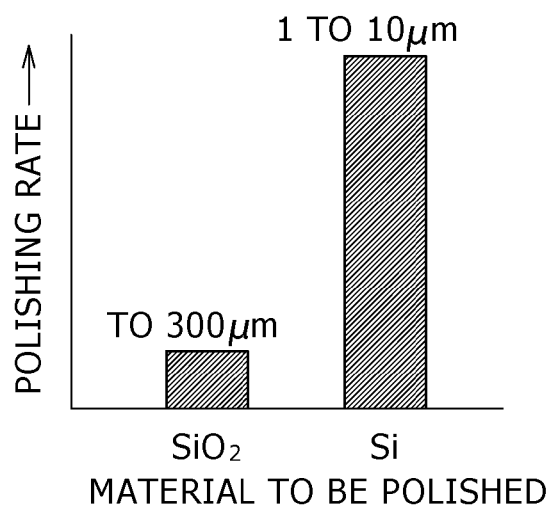
FIG. 4 is a graph showing a polishing rate for silicon and silicon oxide.

FIG. 4 shows the result of measurement of polishing rate made on an $SiO_2$ film and an Si surface in the case that diamond was used as the abrasive grains 43 of the polishing tape 40. As apparent from FIG. 4, the polishing rate for the $SiO_2$ film is remarkably lower than that for the Si surface. This result suggests that the end surface of the wafer W is protected by the $SiO_2$ film formed on the end surface of the wafer W in polishing it with the abrasive grains 43. This result is considered to be due to the fact that the penetration of the abrasive grains 43 into the $SiO_2$ film is harder than that into the Si surface.

According to the polishing method as mentioned above, the end surface of the wafer W is polished in the condition where the polishing liquid L containing an oxidizing agent is supplied to the end surface of the wafer W. Accordingly, even in the case that the Si surface of the wafer W is exposed by polishing, the oxide film 51 as a protective film is formed on the Si surface of the wafer W by the oxidizing agent in the polishing operation, so that the polishing marks D by the abrasive grains 43 are hardly left on the end surface of the wafer W owing to the presence of the oxide film 51. Thus, the polishing can be performed in the condition where the end surface of the wafer W is protected, thereby preventing the production of cracks.

While hydrogen peroxide is used as the oxidizing agent contained in the polishing liquid L in this preferred embodiment, the oxidizing agent in the present invention is not limited to hydrogen peroxide. Other examples of the oxidizing agent usable in the present invention include PIA ($HIO_4.2H_2O$), HDA ($H_2NOH$), APS (($NH_4$)$_2S_2O_8$), Ce($NH_4$)$_2$ ($NO_3$)$_6$, SMA ($SiO_2 12MoO_3.nH_2O$), and IN (Fe ($NO_3$)$_3$. $9H_2O$)

(Modifications)

In the first preferred embodiment mentioned above, the polishing device and polishing method according to an embodiment of the present invention employ the polishing tape 40 having the abrasive grains 43 fixed to the front surface thereof. The polishing tape employable in the present invention may have asperities on the front surface rather than the abrasive grains 43. Some modifications using such a polishing tape will now be described with reference to FIGS. 5A to 5C.

Figure 5A:
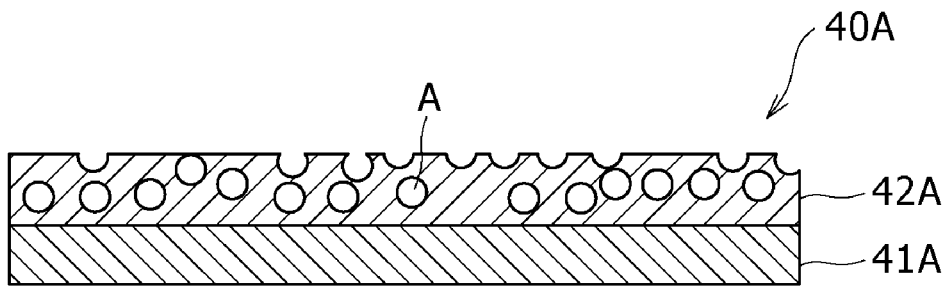
FIGS. 5A, 5B, and 5C are sectional views showing various modifications of a polishing tape usable in the present invention.

Referring to FIG. 5A, there is shown a polishing tape 40A composed of a film base 41A and a polishing layer 42A formed on the upper surface (front surface) of the film base 41A. For example, the film base 41A is formed of PET, and the polishing layer 42A is formed of foamed polyurethane. The polishing tape 40A is produced by foaming polyurethane containing a foaming agent and attaching the resultant foamed polyurethane as the polishing layer 42A to the film base 41A. Accordingly, the polishing layer 42A has numerous pores A due to the foaming of polyurethane, so that asperities are formed by the pores A on the upper surface of the polishing tape 40A as shown.

Figure 5B:
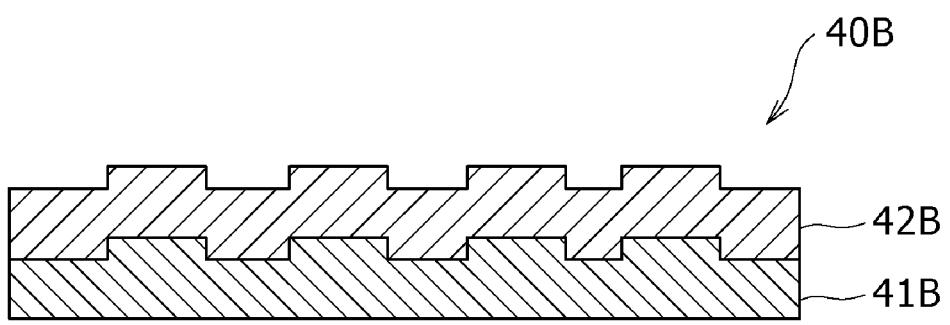

Referring to FIG. 5B, there is shown a polishing tape 40B composed of a film base 41B having asperities on the upper surface (front surface) thereof and a polishing layer 42 formed on the uneven upper surface of the film base 41B. For example, the film base 41B is formed of PET, and the polishing layer 42B is formed of polyurethane. Accordingly, the upper surface (front surface) of the polishing layer 42B has asperities following the asperities of the film base 41B, so that the upper surface of the polishing tape 40B has asperities.

Figure 5C:
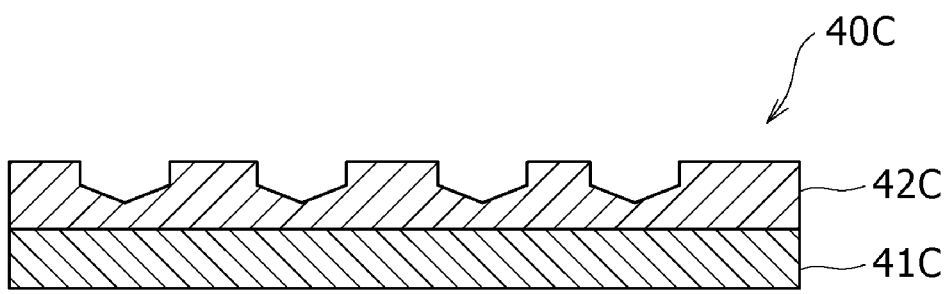

Referring to FIG. 5C, there is shown a polishing tape 40C composed of a film base 41C and a polishing layer 42C formed on the upper surface (front surface) of the film base 41C and having asperities on the upper surface (front surface) thereof. For example, the film base 41C is formed of PET, and the polishing layer 42C is formed of polyurethane. The asperities of the upper surface of the polishing layer 42C are formed by using a diamond conditioner to recess the upper surface of an unworked polyurethane sheet for the polishing layer 42C. Alternatively, the asperities of the upper surface of the polishing layer 42C may be formed by bringing an unworked polyurethane sheet for the polishing layer 42C into contact with a metal drum having asperities on the outer circumferential surface thereof to thereby transfer the shape of the outer circumferential surface of the metal drum to the unworked polyurethane sheet. Also in this case, the upper surface of the polishing tape 40C has asperities.

In the case of using the polishing tape 40A, 40B, or 40C having asperities on the upper surface thereof, mechanical polishing can be suppressed as compared with the case of using the polishing tape 40 having the abrasive grains 43 fixed to the upper surface thereof. Accordingly, the end surface of the wafer W can be polished more reliably in its protected condition, thereby preventing the production of cracks.

Second Preferred Embodiment

A second preferred embodiment of the present invention will now be described. In the following description of the second preferred embodiment, the difference between the first preferred embodiment and the second preferred embodiment is focused and the description of other similar points is omitted herein.

Figure 6:
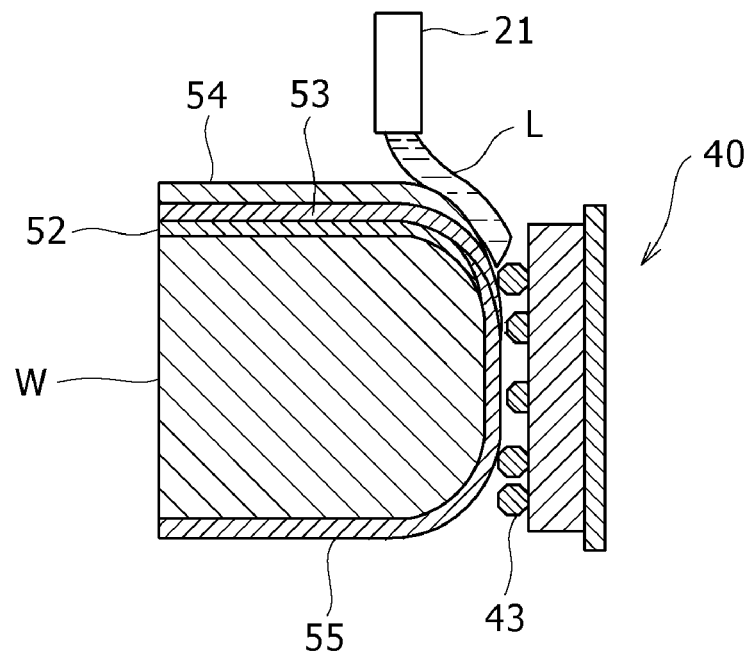
FIG. 6 is a sectional view for illustrating a polishing method according to a second preferred embodiment of the present invention.

In the second preferred embodiment, the wafer W to be polished is a wafer on which copper (Cu) wiring has been formed. As shown in FIG. 6, an $SiO_2$ film 52 is formed as an interlayer insulating film on the upper surface to the end surface of the wafer W, and a barrier metal film 53 for preventing diffusion of Cu from the Cu wiring is formed on the $SiO_2$ film 52. Further, a metal film 54 as a Cu wiring film is formed on the barrier metal film 53. On the other hand, a silicon nitride film (SiN film) 55 is formed on the lower surface to the end surface of the wafer W.

In this preferred embodiment, the nozzle 21 of the polishing device is preferably located so as to supply the polishing liquid L directly toward the end surface of the wafer W held by the wafer holding section 10. By supplying the polishing liquid L directly toward the end surface of the wafer W, the metal film 54 formed on the upper surface of the wafer W is not oxidized by the polishing liquid L.

By using the polishing device according to this preferred embodiment, the metal film 54 and the barrier metal film 53 formed on the end surface of the wafer W having Cu wiring are polished. In this preferred embodiment, the metal film 54 and the barrier metal film 53 formed on the end surface of the wafer W are oxidized to become weak by the polishing liquid L containing an oxidizing agent, so that the polishing can be accelerated. In addition, the end surface of the wafer W is protected by the $SiO_2$ film 52 and the SiN film 55.

If Si forming the wafer W is exposed to the end surface of the wafer W, Cu forming the metal film 54 is diffused into the wafer W in this polishing method. It is therefore necessary to reliably leave the $SiO_2$ film 52 and the SiN film 55 on the end surface of the wafer W. To this end, it is preferable to use silica abrasive grains having a mesh size of about #30000, which hardly polishes an $SiO_2$ film, as the abrasive grains 43 of the polishing tape 40.

According to this polishing method, the polishing can be performed in the condition where the end surface of the wafer W is protected. Further, according to this polishing method, the metal film 54 and the barrier metal film 53 are oxidized by the polishing liquid L containing an oxidizing agent in performing the polishing, so that the polishing rate can be increased.

Third Preferred Embodiment

A third preferred embodiment of the present invention will now be described. In the following description of the third preferred embodiment, the difference between the second preferred embodiment and the third preferred embodiment is focused and the description of other similar points is omitted herein.

As similar to the second preferred embodiment, the wafer W to be polished in a wafer on which Cu wiring has been formed. In a polishing method according to the third preferred embodiment, two different polishing liquids are used in polishing the end surface of the wafer W.

Figure 7:
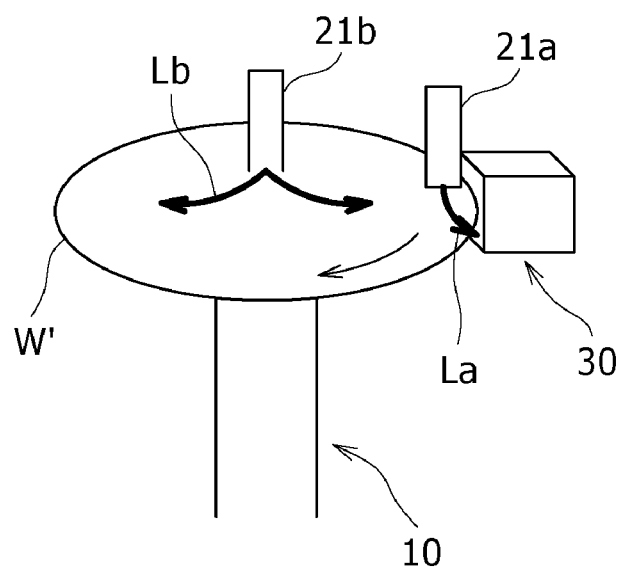
FIG. 7 is a schematic perspective view for illustrating a polishing device according to a third preferred embodiment of the present invention.
Figure 8A:
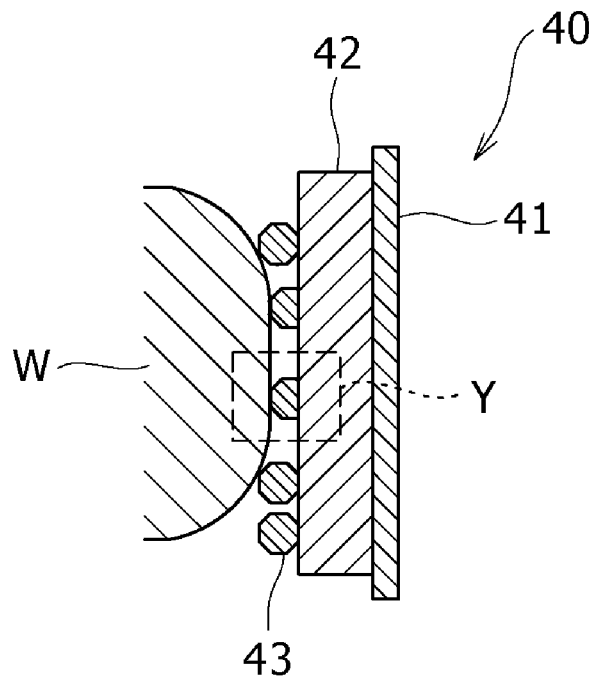
FIG. 8A is a sectional view for illustrating a polishing method in the past.
Figure 8B:
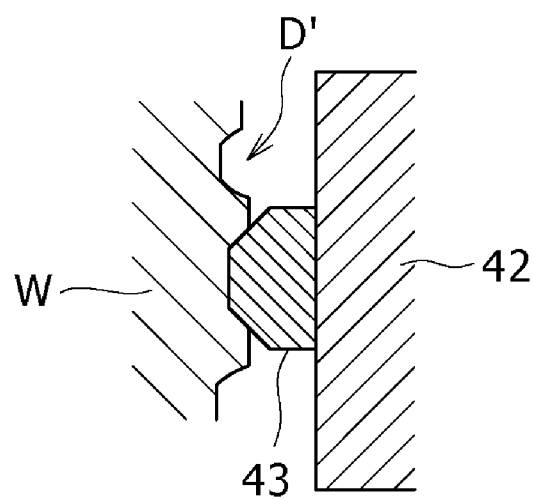
FIG. 8B is an enlarged view of a region Y shown in FIG. 8A.

FIG. 7 is a schematic perspective view of a polishing device used in carrying out the polishing method according to the third preferred embodiment. The polishing liquid supplying section 20 in the polishing device shown in FIG. 7 includes two nozzles 21a and 21b for respectively supplying two different polishing liquids La and Lb to the surface of the wafer W. The nozzle 21a is configured so as to supply the polishing liquid La containing an oxidizing agent such as hydrogen peroxide directly toward the end surface of the wafer W held by the wafer holding section 10. On the other hand, the nozzle 21b is configured so as to supply the polishing liquid Lb containing a metal complexing agent such as quinaldic acid to a substantially central portion of the upper surface of the wafer W held by the wafer holding section 10.

By supplying the polishing liquid Lb containing a metal complexing agent in addition to the polishing liquid La containing an oxidizing agent, a complex of metal materials forming the metal film 54 and the barrier metal film 53 with this metal complexing agent can be formed. Accordingly, the polishing rate can be further increased as compared with the case of supplying only the polishing agent La containing an oxidizing agent.

The metal complexing agent contained in the polishing liquid Lb is preferably insoluble in the polishing liquid Lb. Accordingly, by supplying the polishing liquid Lb containing such an insoluble metal complexing agent to a substantially central portion of the upper surface of the wafer W, the polishing liquid Lb exerts no complexing action until it is mixed with the polishing liquid La containing an oxidizing agent. As a result, the polishing rate for the metal film 54 and the barrier metal film 53 formed on the end surface of the wafer W can be increased. However, the nozzle 21b may be located so as to supply the polishing liquid Lb directly toward the end surface of the wafer W.

According to this polishing method, the polishing can be performed in the condition where the end surface of the wafer W is protected. Further, according to this polishing method, the metal film 54 and the barrier metal film 53 are oxidized by the polishing liquid La containing an oxidizing agent, and a metal complex of the metal film 54 and the barrier metal film 53 is formed by the polishing liquid Lb containing a metal complexing agent, so that the polishing rate can be further increased.

Also in the second and third preferred embodiments mentioned above, the polishing tape 40A, 40B, or 40C having asperities formed on the upper surface thereof shown in FIG. 5A, 5B, or 5C may be used. Also in this case, mechanical polishing can be suppressed as compared with the case of using the polishing tape 40 having the abrasive grains 43 fixed to the upper surface thereof. Accordingly, the $SiO_2$ film 52 and the SiN film 55 as protective layers formed under the metal film 54 and the barrier metal film 53 can be left more reliably, and the end surface of the wafer W can be polished more reliably in its protected condition, thereby preventing the production of cracks.

While the polishing tape 40 having the abrasive grains 43 fixed to the upper surface thereof or the polishing tape 40A, 40B, or 40C having asperities formed on the upper surface thereof is used in the first to third preferred embodiments and the modifications mentioned above, a polishing tape having no abrasive grains or no asperities on the upper surface thereof may be used in the present invention. However, the polishing rate is higher in the case of using a polishing tape having abrasive grains or asperities on the upper surface thereof.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A polishing method for polishing the end surface of a wafer by using a polishing tape, the polishing method comprising the steps of:
    applying a first polishing liquid containing an oxidizing agent to the edge surface of said wafer thereby forming a protective layer via an oxide film on the edge surface of said wafer;
    applying a second polishing liquid containing a metal complexing agent to the edge surface of said wafer; and
    mixing said first polishing liquid with second polishing liquid at the edge surface of said wafer and polishing said edge surface of said wafer in the presence of the mixed polishing liquids by pressing the polishing tape against said edge surface of said wafer.

2. The polishing method according to claim 1, wherein
    said polishing tape has abrasive grains fixed to a front surface of said polishing tape, and
    the edge surface of said wafer is polished by pressing the front surface of said polishing tape against the edge surface of said wafer.

3. The polishing method according to claim 1, wherein
    said polishing tape has asperities formed on the front surface of said polishing tape, and
    the edge surface of said wafer is polished by pressing the front surface of said polishing tape against the edge surface of said wafer.

4. The polishing method according to claim 1, wherein,
    said oxidizing agent is applied to the edge surface by a first nozzle by applying said oxidizing agent directly toward said edge surface of said wafer, and
    said complexing agent is supplied to the edge surface by a second nozzle by applying said complexing agent to a central portion of said wafer.

5. The polishing method according to claim 1, wherein said complexing agent is insoluble in said second polishing liquid.

6. The polishing method according to claim 2, wherein said abrasive grains are one of silicon carbide, aluminum oxide, chromium oxide, iron oxide, cerium oxide, and silica.

7. A polishing device for configured to polish the edge surface of a wafer by using a polishing tape, comprising:
    a wafer holding section to rotatably hold said wafer;
    a polishing liquid supplying section having a first nozzle at a first point along a common radius of the wafer for supplying a first polishing liquid containing an oxidizing agent to the edge surface of sad wafer thereby forming a protective layer via an oxide film on said edge surface of said wafer and a second nozzle at a second point along the common radius of the wafer for supplying a second polishing liquid containing a metal complexing agent to the edge surface of said wafer, the first nozzle and the second nozzle supplying a polishing liquid to different surfaces of said wafer held by said wafer holding section along the common radius of said wafer held by said wafer holding section such that said first polishing liquid with said oxidizing agent and said second polishing liquid with said metal complexing agent are mixed at the edge surface of said wafer;

a tape holding section to hold said polishing tape under tension so that a front surface of said polishing tape is opposed to the edge surface of said wafer held by said wafer holding section; and a tape pressing section having a pad to press the front surface of said polishing tape against the edge surface of said wafer held by said wafer holding section from a back surface of said polishing tape to polish said edge surface of said wafer in the presence of said mixed polishing liquids.

8. The polishing device according to claim 7, wherein said first nozzle supplies a polishing liquid containing an oxidizing agent onto a substantially central portion of an upper surface of said wafer.

9. The polishing device according to claim 7, wherein said first nozzle supplies a polishing liquid containing an oxidizing agent directly toward the edge surface of said wafer.

10. The polishing device according to claim 7, wherein said first nozzle supplies a first polishing liquid containing an oxidizing agent directly toward the edge surface of said wafer and said second nozzle supplies a second polishing liquid containing a metal complexing agent onto a substantially central portion of an upper surface of said wafer so that no complexing action is exerted until the complexing agent is mixed with the first polishing liquid.

11. The polishing device according to claim 10, wherein said complexing agent is insoluble in said second polishing liquid.

12. The polishing device according to claim 10, wherein the complexing agent is quinaldic acid.

13. The polishing method according to claim 7, wherein said polishing tape has abrasive grains fixed to said front surface of said polishing tape.

14. The polishing method according to claim 13, wherein said abrasive grains are one of silicon carbide, aluminum oxide, chromium oxide, iron oxide, cerium oxide, and silica.

15. A polishing method to polish an edge surface of a wafer by using a polishing tape, the polishing method comprising the steps of:

applying a first polishing liquid containing an oxidizing agent to a first point along a common radius of a wafer to form a protective layer via an oxide film on said edge surface of said wafer;

applying a second polishing liquid containing a metal complexing agent to a second point along the common radius of the wafer to form a metal film on said edge surface of said wafer; and mixing said first polishing liquid with said second polishing liquid at an edge surface of said wafer and polishing said edge surface of said wafer in the presence of the mixed polishing liquids by pressing the polishing tape against said edge surface of said wafer.

16. The polishing method according to claim 15, wherein, said first point along said common radius of said wafer is an edge surface of said wafer and said first polishing liquid is applied directly to said edge surface of said wafer; and said second point along said common radius of said wafer is a central portion of said wafer and said second polishing liquid is applied directly to said central portion of said wafer.

17. The polishing method according to claim 15, wherein said metal film is formed on the edge surface of said wafer on a dielectric film.

18. The polishing method according to claim 15, further comprising the step of:

polishing the edge surface of said wafer by oxidizing said metal film using said oxidizing agent to remove said metal film.

* * * * *